PUSH-PULL COMPLEMENTARY TYPE TRANSISTOR AMPLIFIER

Filed May 28, 1953 2 Sheets-Sheet 1

INVENTORS
George C. Sziklai,
Robert D. Lohman &
Allen A. Barco
BY H. L. Newton
ATTORNEY INVENTORS
George C. Sziklai,
Robert D. Lohman &
Allen A. Barco
BY H. C. Newton
ATTORNEY 2,762,870
Patented Sept. 11, 1956

2,762,870

PUSH-PULL COMPLEMENTARY TYPE TRANSISTOR AMPLIFIER

George C. Sziklai, Princeton, Robert D. Lohman, Princeton Junction, and Allen A. Barco, Princeton, N. J., assignors to Radio Corporation of America, a corporation of Delaware Application May 28, 1953, Serial No. 358,102

9 Claims. (Cl. 179—171)

This invention relates generally to signal amplifier circuits having two signal paths arranged for push-pull operation and particularly to semi-conductor signal amplifier circuits of that type.

It has been found that a junction transistor or semi-conductor device of the N–P–N variety has a symmetrical conduction characteristic when compared with a junction transistor or semi-conductor device of the P–N–P variety, and in a like manner it has been found that a point contact transistor of the P variety has a symmetrical conduction characteristic when compared with a point contact transistor of the N variety.

Transistors having these symmetrical characteristics may be utilized to provide a transistor amplifier providing a push-pull output from a single-ended input. This is accomplished by connecting a pair of transistors of opposite conductivity type in parallel. That is, corresponding input electrodes of the transistors are connected for signal conduction or amplification to one of the terminals of an input circuit and corresponding output electrodes of the transistors are connected to one of the terminals of an output circuit. One electrode of each transistor may be common to the input and output circuits and may be connected to a signal current or system ground. Appropriate bias voltages are applied and accordingly the characteristics of opposite conductivity type are such as to produce an opposite output effect from a given input condition. Push-pull amplification is achieved and an amplified single-ended output signal is derived directly from a single-ended input signal.

However, with the circuit arrangements above described, it is difficult to utilize the total bias battery voltage across the entire load due to the fact that the center voltage point of the bias supply has to be connected to the system ground or to be otherwise at ground potential.

There are instances when utilizing an amplifier of this character when it is extremely desirable to instantaneously provide the entire bias battery voltage across the useful output circuit. One such instance is when utilizing the transistor amplifier circuit in an automotive receiver wherein a relatively low source of voltage is available. Further, in automotive radio systems wherein six volt batteries are utilized to provide a bias voltage source it is extremely inconvenient to provide a center tap for the bias source which would be at a three volt point in the center of one of the cells.

Accordingly it is an object of the present invention to provide a novel push-pull amplifier circuit utilizing semi-conductor devices which is capable of providing two signals across a load in push-pull or balanced relation, each approaching the total voltage of the bias supply.

It is a further object of the present invention to provide a novel push-pull amplifier circuit utilizing semi-conductor devices which is capable of providing a push-pull output directly from a single-ended driving source which does not require a center tapped bias voltage source.

It is a still further object of the present invention to provide a novel push-pull or balanced amplifier circuit utilizing semi-conductor devices which are energized by signal voltages of the same instantaneous polarity and wherein the total voltage of the bias voltage supply appears across the output circuit.

It is still another object of the present invention to provide a novel push-pull or balanced amplifier circuit utilizing semi-conductor devices of opposite conductivity type which operate directly from a single-ended driving source and which provides an output signal utilizing the total voltage of the bias supply thus multiplying the voltage swing across the output load.

It is still a further object of the present invention to provide a novel semi-conductor amplifier circuit which is capable of providing two signals in push-pull or balanced relation, each approaching the total voltage of the power supply.

In accordance with a preferred embodiment of the present invention, a pair of semi-conductor devices or transistors of opposite conductivity type are connected in parallel between the amplifier input and output terminals. That is, corresponding input electrodes of the transistors are connected to one of the terminals of an input circuit and corresponding output electrodes of the two transistors are connected to the respective end terminals of an output circuit. One electrode of each transistor may be common to the input and output circuits and may be connected to the signal current ground. Appropriate bias voltages are applied as described more fully hereinafter. Accordingly, since the characteristics of the transistors of opposite conductivity type are such as to produce an opposite output effect from a given input condition, push-pull amplification is achieved and an amplified push-pull output signal is derived directly from a single-ended input signal while utilizing the voltage of the bias source to its fullest extent.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

While the following discussion is directed primarily at the junction variety of transistors it is to be understood that the amplifier system of the present invention can utilize either junction or point contact devices. When utilizing point contact transistors, at least in the present state of the art, it is preferred that the arrangement employ the emitter-input, grounded-base circuit. This is due to the fact that point contact transistors tend to be unstable when there is any appreciable impedance in the base electrode circuit, as is well known.

Figure 1:
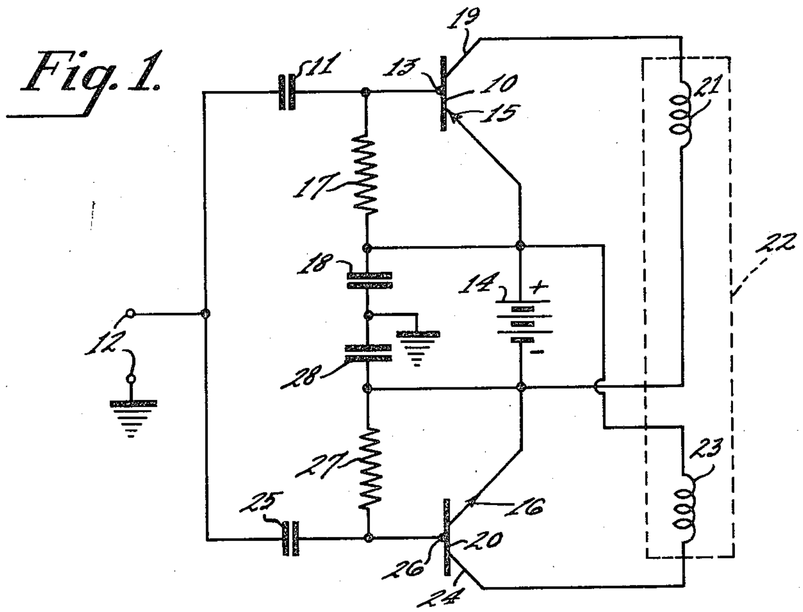
Figure 1 is a schematic circuit diagram of a semi-conductor amplifier circuit of the base-input grounded-emitter type embodying the present invention.

Referring now to the drawing in which like reference characters identify like elements in the various figures, and specifically to the circuit of Figure 1, two junction transistors 10 and 20 of opposite conductivity types are provided therein. By way of example, the transistor 10 may be of the P–N–P variety while the transistor 20 may be of the N–P–N variety as illustrated.

An input coupling capacitor 11 is connected between a high signal voltage terminal of a pair of input terminals 12 and the base electrode 13 of the transistor 10 which functions as a control electrode. The other input terminal may be grounded as indicated.

A source of operating voltage such as a battery 14 is connected between the emitter electrode 15 of the transistor 10 and the emitter electrode 16 of the transistor 20, and a base resistor 17 is connected between the base electrode 13 and the emitter electrode 15. The ohmic resistance of the base resistor may be selected to equal the forward resistance of the emitter-base path of the transistor 10. Also, a signal frequency bypass capacitor 18 may be connected between the emitter electrode 15 and a point of fixed reference potential such as ground to maintain the emitter electrode 14 at signal ground potential.

The collector electrode 19 of the transistor 10 which functions as the output electrode is connected directly to one terminal of an impedance element 21 which, as illustrated, is one half of a load impedance 22. The impedance element 21 is illustrated as an inductor which may be taken to represent one-half of a deflection yoke or loudspeaker voice coil or one-half of the primary winding of an output transformer, or other load means.

A parallel signal path between the input terminals 12 and one terminal of a second impedance element 23 constituting the other half of the load impedance 22 similarly includes the second transistor 20 which is illustrated as an N–P–N variety having a collector electrode 24 connected directly to the one terminal of the impedance element 23. An input coupling capacitor 25 is connected between the high voltage terminal of the pair of input terminals 12 and the base electrode 26 of the transistor 20. A second bias resistor 27 may be connected between the base electrode 26 and the emitter electrode 16. A signal frequency bypass capacitor 28 may be connected between ground, the junction of the bias resistor 27 and the emitter electrode 16 to maintain this emitter electrode at signal ground potential.

It is readily seen that with this circuit arrangement the emitter electrodes 15 and 16 are common to both the input and output circuits, that is, they are in this case, the common electrodes. Since the emitter electrode 15 is connected to the positive terminal of the battery 14 and the collector electrode 19 is connected to the negative terminal of the battery 14 through the impedance element 21, and as the bias resistor 17 tends to maintain the base electrode 13 at the same potential as its respective emitter electrode 15, it will be observed that the collector electrode 19 is biased in a reverse or low conducting direction with respect to the base electrode 13. Also, since the transistor 20 is of an opposite conductivity type from the transistor 10 and the battery 14 is connected so as to be poled in an opposite direction relative to the transistor 20, it will be evident that the collector electrode 24 is biased in a reverse direction with respect to the base electrode 26.

The output current of the transistor 10 can be considered to flow from the battery 14 into the emitter electrode 15, out of the collector electrode 19 through the impedance element 21 to the negative terminal of the battery 14. When the direction of current flow is referred to herein, the conventional concept that current flows from a point of positive polarity to a point of less positive polarity is applied. A positive signal voltage applied from the input terminals between the base electrode 13 and the emitter electrode 15 of the transistor 10 drives the potential of the base electrode in a positive direction with respect to the emitter electrode. Since the transistor 10 is of the P–N–P variety, this will reduce the amplitude of the collector electrode current previously described. Similarly a negative signal pulse will tend to increase the collector electrode current.

Since the second transistor 20 may be of the N–P–N variety or opposite conductivity type, the output or collector electrode current which flows in this case into the collector electrode 24 will increase in amplitude when the base electrode 26 is driven by the signal voltage in a positive direction with respect to the emitter electrode 16. The collector electrode current can be considered to flow from the positive terminal of the battery 14 through the impedance element 23 into the collector electrode 24 and out of the emitter electrode 23 back to the battery 14. The output currents, therefore, are seen to flow in opposite directions through their respective portions of the load impedance.

If an alternating input signal voltage is now applied between the input terminals 12, each of the base electrodes 13 and 26 will be driven instantaneously and equally in the same direction, that is, the direction of polarity with respect to ground. However, the input signal will produce opposite effects on the collector electrode currents of the two transistors. Thus, as the collector electrode current of the transistor 10 flowing in one direction through the impedance element 21 decreases in amplitude, the collector electrode current of the transistor 20 flowing in the opposite direction through the impedance element 23 will increase in amplitude. The effective change of output current through the total output load may, therefore, be considered the effective differential current and is an alternating current corresponding to the applied input signal.

The push-pull transistor amplifiers of the present invention can be operated as class A, B or C amplifiers by suitable selection of the circuit parameters in a manner analogous to the operation of vacuum tube amplifiers. In general the class of operation is expressed in terms of the amplifier performance and the values are chosen to produce the performance desired. The circuit illustrated in Figure 1 and operated as above described will produce class B operation.

The circuit of Figure 1 may be also operated class A or class C by suitably biasing the base electrodes 13 and 26 relative to the respective emitter electrodes 15 and 16. For class A operation with presently available transistors, the base electrode 13 of the P–N–P transistor will be biased negatively by about one-tenth to eight-tenths volts with respect to the emitter electrode 15 and the base electrode 26 of the N–P–N transistor will be biased an equal amount positively with respect to its emitter electrode 16, these bias voltages being in the forward direction in each case. Since during class A operation a small current will flow through each bias resistor, the voltage drop across the bias resistor must be taken into consideration. Thus where battery bias is employed, the actual battery voltage must exceed the desired bias voltage by amount equal to the voltage drop across the bias resistor. For class C operation the base electrode 13 of the P–N–P transistor will be biased to cut off or below by applying bias voltages from one-tenth to ten volts positive with respect to the emitter electrode 15. The base electrode 26 of the N–P–N transistor will be biased a corresponding amount negative with respect to its emitter electrode 16, these bias voltages being in the reverse direction in each case.

Bias voltages may be obtained by inserting appropriately poled batteries in the base-emitter circuit, by returning the base or emitter leads to a suitable tap on the battery 14 or as described hereinafter in connection with certain of the other embodiments of the invention. The actual value of the class C bias depends upon the amplitude of the input signal and the degree of cut off desired. All the bias voltages also depend upon the operating characteristics of the transistors employed. Bias voltages may be readily adjusted to the desired value by observing the wave shape of a test voltage with a cathode ray oscilloscope in a conventional manner.

In class A operation the base electrode of the P–N–P transistor is made slightly negative and the base electrode of the N-P-N transistor is made slightly positive relative to their respective emitter electrodes. As a result both transistors become conducting in the absence of signal input. Consequently, substantially zero signal current flows around each of the loops which are formed by the battery 14, the respective transistors and the two halves of the output impedance 22.

Let it now be assumed that the circuit shown in Figure 1 has been adjusted for class B operation as above described. In this condition the collector currents of each of the two transistors will be substantially cut off. Accordingly, a very small amount of current, if any, will be flowing through the external circuits connected to the respective collector electrodes.

If under the above condition, an input signal is applied to the input terminals 12, which is assumed to provide an instantaneous positive voltage at the base electrodes relative to ground, the base electrode 13 will be driven more positively with respect to the emitter electrode 15 and accordingly in view of the fact that the transistor 10 is of the P-N-P variety, essentially no effect will be obtained in the collector electrode circuit as the effect of the input voltage is to reduce the collector electrode current which is already essentially at zero.

However, the same instantaneous voltage is also applied to the base electrode 26 driving it positive with respect to the emitter electrode 16. In view of the fact that the transistor 20 is of the N-P-N variety, this signal voltage will cause the bias voltage between the base electrode 26 and the emitter electrode 16 to be increased in a forward direction and accordingly the collector electrode current of the collector electrode 24 will be increased in accordance with the magnitude of the input voltage. It is thus readily seen that with a positive input pulse applied to the circuit as shown, a signal current will be caused to flow in the corresponding half of the output impedance 22 while no output current will be caused to flow in the other half of output impedance 22.

If on the other hand, an input signal voltage which is negative is applied to the input terminals 12, there will be essentially no effect on the conduction of the transistor 20. However, since the base electrodes will then be driven negatively, the base electrode 13 will be driven in such a direction as to bias the base-emitter circuit of the transistor 10 in a forward direction, causing an output current to flow in the collector electrode circuit through the other half of the output impedance 22 which is responsive to the input voltage. In this instance, however, essentially no effect will be seen in the collector electrode circuit of the transistor 20.

It, therefore, may be readily seen that with this circuit adjusted for class B operation, essentially the entire voltage of the battery 14 may be utilized across each of the two halves of the impedance 22 on corresponding half cycles of an input wave. It is thus seen that if the two halves of the output impedance 22 represent halves of a deflection yoke, a loudspeaker voice coil or the primary winding of an output transformer, essentially the entire voltage of the bias supply may be utilized in developing each of the two portions of an output signal in push-pull thus apparently doubling the voltage swing across the load, while still providing a reduction of distortion and without a push-pull input signal.

Figure 2:
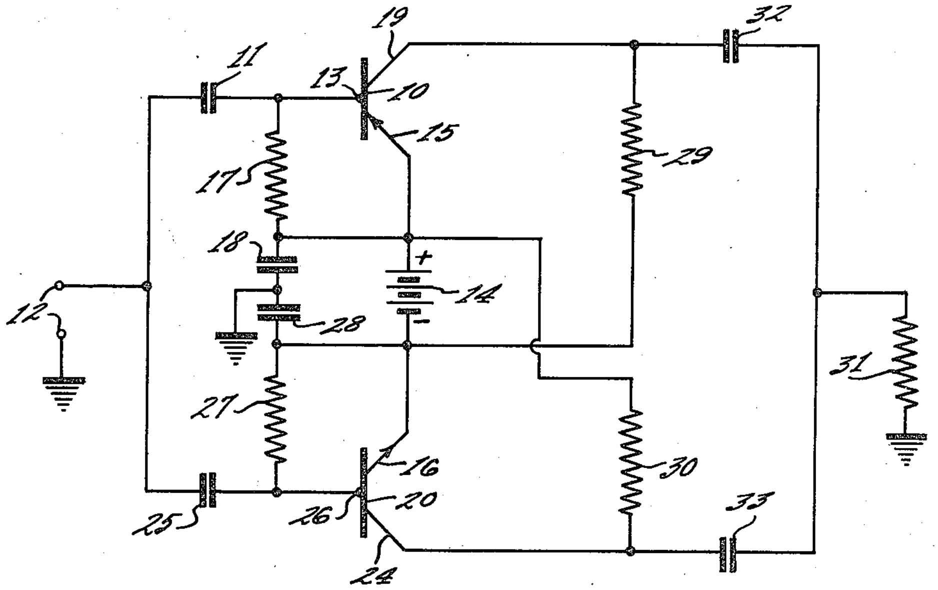
Figure 2 is a schematic circuit diagram of the semi-conductor amplifier circuit of Figure 1, showing a modification thereof in accordance with the present invention.

Figure 2 illustrates a modification of the circuit of Figure 1 wherein a resistive load is utilized in place of the inductive reactive elements 21 and 23 shown in Figure 1. The input circuit and the biasing circuit for the two junction transistors 10 and 20 is substantially identical to that shown in Figure 1. However, the collector electrode 19 of the junction transistor 10 is connected to the positive terminal of the battery 14 through a load resistor 29, and the collector electrode 24 of the junction transistor 20 is connected to the negative terminal of the battery 14 through a load resistor 30. An output circuit may be provided by an output load impedance illustrated as a resistor 31 having one end connected in common to the collector electrodes 19 and 24 by means of a pair of coupling capacitors 32 and 33, and the other end connected to ground.

It may thus be seen that the operation of this circuit is substantially identical to the operation of the circuit illustrated in Figure 1. This operation is as follows: The collector current flowing out of the collector electrode 19 will flow through the load resistor 29 to the negative terminal of the battery 14 and the collector current flowing out of the positive terminal of the battery 14 will flow through the load resistor 30 into the collector electrode 24. It is thus seen that the currents flowing through the two load resistors 29 and 30 are in the same direction relative to the output terminals.

Accordingly if it is assumed that the amplifier circuit has been adjusted for class B operation and substantially no collector electrode current is flowing in either of the two transistors 10 and 20 and a positive going signal is then applied to the input terminals 12, it is seen that there will be no change in the voltage developed across the load resistor 29 as a positive going signal will cause no change in the conduction characteristics of the transistor 10 assuming it has been initially adjusted for cut-off.

However, a positive going signal will provide a forward bias between the emitter electrode 16 and its corresponding base electrode 26 thereby causing an increase in the current flow in the collector electrode 24. A voltage drop will accordingly be developed across the load resistor 30 due to this collector electrode current caused by the input signal which will be positive with respect to the junction of the load resistor 30 and the output capacitor 33. Accordingly it is seen that a voltage which is representative of the input signal will appear across the output load resistor 31.

In a similar manner if an input signal which is negative is applied to the input terminals 12, an output voltage of opposite polarity will be developed and appear across the output load resistor 31.

It may be also readily seen that this circuit may be adjusted for class A or class C operation as above described and that in each instance an amplified version of the input signal will appear across the output load resistor 31.

Figure 3:
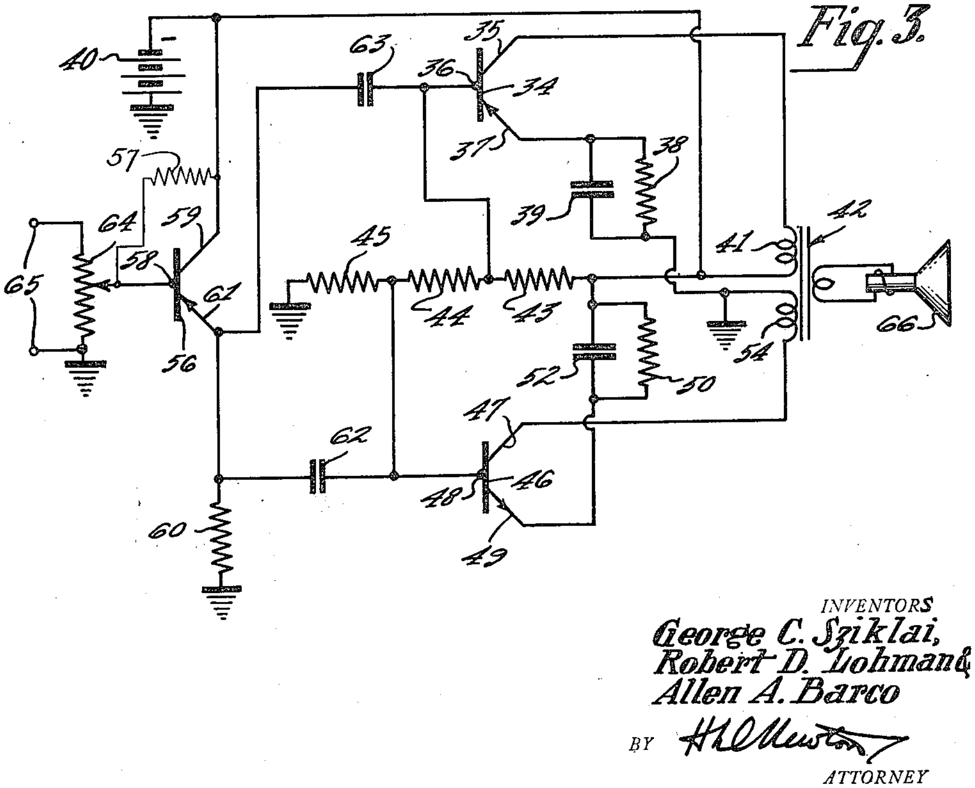
Figure 3 is a schematic circuit diagram of a semi-conductor amplifier system for phonograph record reproduction incorporating a semi-conductor amplifier of the base-input grounded-emitter type and embodying the present invention.

Figure 3 illustrates a practical transistor audio frequency amplifier system which may be the audio frequency amplifying portion of a radio receiver or system for reproducing recorded sound, light and the like, or music and speech from conventional phonograph records or magnetic tapes. The push-pull or balanced output stage includes a first transistor 34 which may be a junction transistor of the P-N-P variety having a collector electrode 35, a base electrode 36, and an emitter electrode 37.

A current limiting resistor 38 may be connected in series arrangement between the emitter electrode 37 and ground and may be bypassed at signal frequencies by a capacitor 39 connected in shunt therewith. Bias for the circuit may be provided by means of a battery 40 which is connected to the collector electrode 35 through one half 41 of the primary winding of an output transformer 42. Bias voltage for the base electrode-emitter electrode circuit is provided by a voltage divider network comprising three voltage dividing resistors 43, 44 and 45 connected in series between the negative terminal of the battery 40 and ground. The base electrode 36 which functions as the input electrode is connected to the junction of the voltage dividing resistors 43 and 44 and is, therefore, at a potential which is less negative with respect to ground than the potential of the emitter electrode.

For presently available transistor devices, the voltage which is provided by the biasing network is such as to provide a bias voltage in the order of two tenths volts between the base electrode 36 and the emitter electrode 37 in the forward direction, that is, the emitter 37 is positive with respect to the base electrode 36.

The second transistor 46 may be a junction transistor of the N–P–N variety and includes a collector electrode 47, a base electrode 48 and an emitter electrode 49. The circuit for the N–P–N transistor is same as that described in connection with the P–N–P transistor. A current limiting resistor 50 may be connected between the emitter electrode 49 and the negative terminal of the battery 40 and may be shunted by a signal bypass capacitor 52. Biasing voltage for the base electrode-emitter electrode circuit is provided by the same voltage divider network as before described comprising the series arrangement of resistors 43, 44 and 45. The base electrode 48 is connected to the junction of the voltage dividing resistors 44 and 45. The net bias voltage applied to the base electrode of the N–P–N transistor 46 is caused to be the same as that applied to the base of the P–N–P transistor 34. The base electrode 48 is connected to the junction of the biasing resistors 44 and 45 as above described to provide a bias of opposite polarity as that applied to the base electrode 36.

The collector electrode circuit of the N–P–N junction transistor is completed to ground and hence the positive terminal of the battery 40 by means of the second half 54 of the primary winding of the output transformer 42.

An input signal for the push-pull output stage may be provided by means of an additional P–N–P junction transistor preamplifier which includes the junction transistor 56. A biasing and input resistor 57 is connected between the base electrode 58 and the negative terminal of the bias battery 40, the positive terminal of which is grounded as above described.

The collector electrode 59 is connected directly to the negative terminal of the battery 40. A load resistor 60 may be connected between the emitter electrode 61 and ground. It will be seen that it is across this load resistor 60 that the signal voltage is developed and applied to the push-pull transistor amplifier circuit. A coupling capacitor 62 is connected between the emitter electrode 61 and the base electrode 48 of the N–P–N junction transistor of the output circuit. A second coupling capacitor 63 is connected between the emitter electrode 61 and the base electrode 36 of the P–N–P junction transistor of the output circuit. An input signal for the transistor preamplifier may be developed across an input impedance illustrated as a volume control potentiometer 64 connected across a pair of input terminal 65, one of which is at ground potential.

It is to be understood that the input or preamplifier for the push-pull transistor amplifier above described may be a single transistor preamplifier as shown or an amplifier utilizing an electron discharge device. A phonograph pickup device or other suitable signal source may be connected with the terminals 65.

Signal voltages which are applied to the input terminals 65 from a pickup device or other source are applied through the potentiometer 64 between the base electrode 58 and the emitter electrode 61 of the preamplifier transistor 56, thereby causing a variation in the emitter-collector current flowing through the emitter load resistor 60. These current variations produce voltage variations across the emitter load resistor 60 which in turn are impressed simultaneously between the base electrodes 36 and 48 and their respective emitter electrodes 37 and 49.

As above discussed, the transistors 34 and 46 are of opposite conductivity type, that is, the transistor 34 is of the P–N–P variety, whereas the transistor 46 is of the N–P–N variety, and accordingly the applied signal voltage will, in the present example, cause the collector electrode currents of the transistors 34 and 46 flowing in opposite directions to the respective halves of the primary winding of the transformer 42 to change in opposite directions thereby producing a differential current through the secondary winding 68 of the output transformer 42 and the voice coil of a loudspeaker device 68 connected with said winding. The differential current operates the loudspeaker device as an amplified reproduction of the input signal voltage.

It will be appreciated that while this invention has been described by reference to point contact and junction transistors, it is in no way limited to transistors of these specific forms. Other devices which have operating characteristics which are complementary and symmetrical in the N and P forms may also be used in accordance with the teachings of this invention even though they may differ in the detailed manner in which the output currents are controlled by the input voltages.

It can thus be seen that the present invention provides a transistor amplifier which is capable of amplifying, by push-pull operation, a single-ended input signal voltage to produce directly a push-pull output signal. Furthermore, no center tapped bias voltage source is required, and the total voltage of the bias supply is utilized across the effective load.

What is claimed is:

1. In combination with a pair of semi-conductor devices of opposite conductivity type, each including input, output and common electrodes, means for applying a signal voltage of the same instantaneous polarity to said input electrodes, first load means connected between the output electrode of one of said devices and the common electrode of the other of said devices, second load means connected between the output electrode of the other of said devices and the common electrode of said one of said devices, and means providing a biasing voltage between said common electrodes for controlling the operation of said devices in balanced relation.

2. In combination with a pair of semi-conductor devices of opposite conductivity type, each including base, collector and emitter electrodes, means for applying an input signal voltage of the same instantaneous polarity to the base electrodes of both of said devices, an output circuit comprising a pair of impedance elements each connected between the collector electrode of one of said devices and the emitter electrode of the other of said devices and a source of biasing voltage connected between said emitter electrodes for biasing the collector electrodes of each of said devices in a reverse direction with respect to said base electrodes.

3. The combination comprising a pair of semi-conductor devices each having an input electrode, an output electrode and a common electrode; means for applying equal signal voltages to said input electrodes in like phase with respect to their common electrodes; a source of bias for said devices; an output load device comprising a pair of impedance elements; each of said impedance elements in combination with the output-electrode and common-electrode path of one of said pair of devices and said source of bias being connected in series arrangement to provide a closed output loop; and circuit means connected with said devices for causing currents to flow through one of said devices and one of said pair of impedance elements and through the other of said devices and the other of said pair of impedance elements.

4. The combination comprising a pair of semi-conductor devices of opposite conductivity type each having base and collector electrodes and an emitter electrode; means for applying equal signal voltages to said base electrodes in like phase with respect to said emitter electrodes; a pair of load impedance elements; means connecting one of said pair of impedance elements between the collector electrode of one of said devices and the emitter electrode of the other of said devices; means connecting the other of said pair of impedance elements between the collector electrodes of the other of said devices and the emitter electrode of said one of said devices; means including one of said pair of semi-conductor devices for causing a current to flow through one of said pair of impedance elements and to increase in amplitude predominantly in response to the positive portion of said signal voltage; means including the other of said semi-conductor devices for causing a current to flow through the other of said pair of impedance elements and to increase in amplitude predominantly in response to the negative portion of said voltage; and means providing a single direct-current supply connected with said devices and poled to apply biasing voltages thereto for push-pull signal amplification of said applied signal voltages.

5. The combination comprising a pair of semi-conductor devices of opposite conductivity type each having input and output electrodes and a common electrode; means for applying equal signal voltages to said input electrodes in like phase with respect to said common electrodes; a source of bias for said pair of semi-conductor devices; an output load circuit comprising a pair of substantially equal impedance elements; each of said impedance elements being coupled between a respective one of said output electrodes and a point of signal reference potential and in series with said source of bias and the respective common electrode of the one of said semi-conductor devices; means including one of said semi-conductor devices for causing a current to flow through one of said pair of impedance devices and to increase an amplitude predominantly in response to the positive portion of said signal voltage; said one of said pair of impedance elements having substantially the entire voltage of said bias source impressed thereacross; and means including the other of said semi-conductor devices for causing a current to flow through the other of said pair of impedance elements and to increase an amplitude predominantly in response to the negative portion of said voltage whereby substantially the entire voltage of said bias source is utilized thereacross.

6. The combination comprising a pair of semi-conductor devices each including base and collector electrodes and an emitter electrode, means for applying to each of said base electrodes an alternating signal voltage, the phase and amplitude of said signal voltage applied to the base electrode of one of said devices being the same as the phase and amplitude of the signal voltage applied to the base electrode of the other of said devices; a source of bias connected in series between said emitter electrodes, an output load device comprising a pair of impedance elements, each of said pair of impedance elements being connected between the collector electrode and the emitter electrode of one of said pair of semi-conductor devices in series with said source of bias, and means for causing output currents corresponding to said signal voltage to flow through said devices and said load device, said devices being of opposite conductivity type whereby a first output current flows through one of said pair of semi-conductor devices and one of said pair of impedance elements and is increased in amplitude in response to a change in said signal voltage in one sense and a second output current flows through the other of said pair of semi-conductor devices and the other of said pair of impedance elements and is decreased in amplitude in response to said change in said signal voltage in said one sense.

7. The combination as defined in claim 6 wherein said load device comprises a kinescope deflection yoke and each of said pair of impedance elements comprises one half of said yoke.

8. The combination as defined in claim 6 wherein said load device comprises an output transformer and each of said pair of impedance elements comprises one half of the primary winding of said transformer, said halves of said primary winding being so oriented to be additive in providing an output signal.

9. The combination as defined in claim 6 wherein said load device comprises the voice coil of a loudspeaker and each of said pair of impedance elements comprises one half of said voice coil.

References Cited in the file of this patent

UNITED STATES PATENTS

| | | |
|---|---|---|
| 2,517,960 | Barney et al. | Aug. 8, 1950 |
| 2,620,448 | Wallace | Dec. 2, 1952 |
| 2,666,818 | Shockley | Jan. 19, 1954 |
| 2,666,819 | Raisbeck | Jan. 19, 1954 |